(12) United States Patent
Box (10) Patent No.: US 7,375,794 B2
(45) Date of Patent: May 20, 2008

(54) LITHOGRAPHIC APPARATUS AND DEVICE MANUFACTURING METHOD

(75) Inventor: Wilhelmus Josephus Box, Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 266 days.

(21) Appl. No.: 10/910,792

(22) Filed: Aug. 4, 2004

(65) Prior Publication Data

US 2006/0028627 A1   Feb. 9, 2006

(51) Int. Cl.
   *G03B 27/42* (2006.01)
(52) U.S. Cl. .......................... 355/53; 355/67; 355/71; 378/34
(58) Field of Classification Search ............... 355/30, 355/53, 67, 71, 77; 378/34, 35
   See application file for complete search history.

(56) References Cited

U.S. PATENT DOCUMENTS

| | | | | |
|---|---|---|---|---|
| 4,668,077 | A * | 5/1987 | Tanaka | 355/30 |
| 5,883,704 | A | 3/1999 | Nishi et al. | |
| 6,098,408 | A | 8/2000 | Levinson et al. | 62/3.2 |
| 6,454,987 | B1 * | 9/2002 | Katoh et al. | 264/447 |
| 6,493,151 | B2 * | 12/2002 | Schachar | 359/666 |
| 6,768,600 | B2 * | 7/2004 | Dieker | 359/820 |
| 6,882,477 | B1 * | 4/2005 | Schattenburg et al. | 359/577 |
| 6,888,618 | B2 * | 5/2005 | Sato | 355/67 |
| 2002/0017694 | A1 * | 2/2002 | Yamaguchi | 257/414 |
| 2002/0027644 | A1 | 3/2002 | Bisschops | 355/30 |
| 2002/0074115 | A1 | 6/2002 | Dieker | 165/201 |
| 2003/0015516 | A1 * | 1/2003 | Natsuhara et al. | 219/444.1 |
| 2004/0051984 | A1 | 3/2004 | Oshino et al. | |
| 2004/0053169 | A1 | 3/2004 | Kindt | 430/311 |
| 2004/0252287 | A1 * | 12/2004 | Binnard et al. | 355/53 |

FOREIGN PATENT DOCUMENTS

| | | | |
|---|---|---|---|
| CA | 2 328 017 A1 | | 6/2001 |
| DE | 253652 | * | 3/1977 |
| EP | 1 372 009 A1 | | 12/2003 |
| EP | 1 376 239 A2 | | 1/2004 |
| EP | 1 376 239 A3 | | 6/2005 |
| JP | 05-291117 | | 11/1993 |
| JP | 6-202243 | | 7/1994 |
| JP | 2002-353116 | | 12/2002 |
| JP | 2004-111684 | | 4/2004 |

OTHER PUBLICATIONS

Austrialian Search Report issued for Singapore Application No. 200504355-9, dated Sep. 1, 2006.
ROC (Taiwan) Search Report issued for ROC (Taiwan) Patent Application No. 094125027, dated Mar. 3, 2007.

* cited by examiner

*Primary Examiner*—Della J. Rutledge
(74) *Attorney, Agent, or Firm*—Pillsbury Winthrop Shaw Pittman, LLP

(57) ABSTRACT

A lithographic apparatus is disclosed. The apparatus includes the following components: an illumination system configured to condition a radiation beam, a support constructed to support a patterning device, a substrate support constructed to hold a substrate, and a projection system configured to project the patterned radiation beam onto a target portion of the substrate. The patterning device is capable of imparting the radiation beam with a pattern in its cross-section to form a patterned radiation beam. At least one of the components that experiences a heat load in use is provided with an integrally mounted heating element arranged to maintain the component at a substantially constant temperature.

24 Claims, 4 Drawing Sheets

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which may be alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to image ever smaller features, it has been proposed to use EUV radiation, with a wavelength in the range of from 5 to 20 nm, as the exposure radiation instead of UV, with a wavelength of 193 or 157 nm, as is used often used in current commercial lithography devices. No material capable of forming a refractive lens for optical elements in radiation and/or projection systems for EUV radiation is known, so the radiation and projection systems of an EUV lithographic apparatus are presently made using optical elements, more specifically mirrors, usually multilayer optical elements. The quality of the projected image is extremely sensitive to surface deformations (figure errors) in the optical elements, particularly those of the projection system.

It has been found that the radiation in lithographic apparatus is partly absorbed by the optical elements. This causes the optical elements to heat up. In particular, it has been found that the EUV projection beam is absorbed by optical elements in the radiation and the projection systems. A further problem is that direct thermal conditioning of the optical elements is not possible due to the high dynamic requirements of the optical elements. In the future, if higher outputs are to be achieved using lithographic apparatus operating at relatively short wavelengths, active conditioning of the optical elements, in particular, the optical elements, in the projection and radiation systems may be required if the optical specifications are to be met even when the optical elements are constructed of materials having a very low coefficient of thermal expansion ("CTE"), for example, materials such as ZERODUR®. Another problem is that lithographic apparatus operating at EUV wavelengths operate in vacuum conditions. EP 1 376 239 (US 2004/051984) is concerned with a cooling device for an optical element, wherein the optical element is indirectly cooled by a heat receiving plate. It has been found that cooling of the optical elements in such a manner is difficult to achieve because of the poor heat transfer mechanism in vacuum, since only radiation cooling is possible. In particular, cooling in a vacuum without direct contact, has been found to be an inefficient heat transfer mechanism. A further problem is that thermal conditioning elements that are disposed in direct contact with the optical elements introduce vibrations which compromise the image quality.

SUMMARY

It is an aspect of the present invention to provide a lithographic projection system in which thermal effects of optical elements in the radiation and/or projection systems on imaging quality are further reduced or eliminated. This and other aspects are achieved according to the invention.

According to an aspect of the invention, a lithographic apparatus is provided. The apparatus includes the following components: an illumination system configured to condition a radiation beam, a support constructed to support a patterning device, a substrate support constructed to hold a substrate, and a projection system configured to project the patterned radiation beam onto a target portion of the substrate. The patterning device is capable of imparting the radiation beam with a pattern in its cross-section to form a patterned radiation beam. At least one of the components is provided with an integrally mounted heating element arranged to maintain the component at a substantially constant temperature. The component experiences a heat load when in use.

According to an aspect of the invention, a lithographic projection apparatus is provided. The apparatus is arranged to project a pattern from a patterning device onto a substrate. At least one component in the apparatus is provided with an integrally mounted heating element arranged to maintain the component at a substantially constant temperature. The component experiences a heat load when in use.

According to an aspect of the invention, an illumination system configured to condition a radiation beam is provided. The illumination system includes an optical element. The optical element is provided with an integrally mounted heating element arranged to maintain the optical element at a substantially constant temperature when in use under a thermal load.

According to an aspect of the invention, a projection system configured to project a patterned radiation beam onto a target portion of the substrate is provided. The projection system includes an optical element. The optical element is provided with an integrally mounted heating element arranged to maintain the optical element at a substantially constant temperature when in use under a thermal load.

According to an aspect of the invention, an optical element for a lithographic apparatus is provided. The optical element includes an integrally mounted electrical heating element and an integrally mounted temperature sensor. In response to a temperature sensed by the temperature sensor, the heating element is arranged to maintain the optical element at a substantially constant predetermined temperature.

According to an aspect of the invention, a device manufacturing method for an apparatus is provided. The method includes patterning a beam of radiation, projecting the patterned beam of radiation onto a target portion of a substrate, and maintaining at least one component experiencing a heat load in the apparatus at a substantially constant temperature with an integrally mounted heating element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
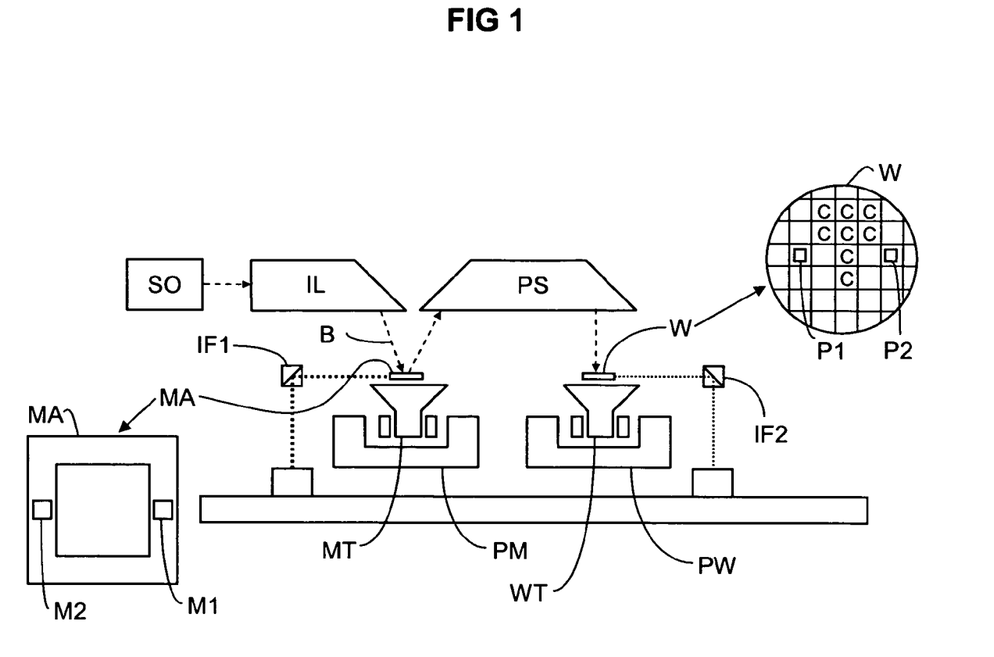
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W. The term substrate table as used herein may also be considered or termed as a substrate support. It should be understood that the term substrate support or substrate table broadly refers to a structure that supports, holds, or carries a substrate.

The illumination system may include various types of optical components, such as refractive, reflective, magnetic, electromagnetic, electrostatic, or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure may use mechanical, vacuum, electrostatic or other clamping techniques to hold the patterning device. The support structure may be a frame or a table, for example, which may be fixed or movable, as required. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section, such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable optical element arrays, and programmable LCD panels. Masks are well known in lithography, and include mask types such as binary, alternating phase-shift, and attenuated phase-shift, as well as various hybrid mask types. An example of a programmable optical element array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source SO and the lithographic apparatus may be separate entities, for example, when the source SO is an excimer laser. In such cases, the source SO is not considered to form part of the lithographic apparatus and the radiation beam is passed from the source SO to the illuminator IL with the aid of a beam delivery system BD including, for example, suitable directing mirrors and/or a beam expander. In other cases, the source SO may be an integral part of the lithographic apparatus, for example, when the source SO is a mercury lamp. The source SO and the illuminator IL, together with the beam delivery system BD, if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. The mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable optical element array of a type as referred to above.

Combinations and/or variations on the above described modes of use or entirely different modes of use may also be employed.

The present invention may be applied to any component in a lithographic apparatus but is particularly advantageous when applied to optical elements in the path of the projection beam, especially those which become heated by the projection beam, such as mirrors in an EUV lithographic apparatus, particularly those of the projection system, where surface deformations have the greatest effect on imaging quality, and those in the beginning of the of the illumination system, where the projection beam intensity is highest, thereby leading to larger temperature variations. The present invention is also particular applicable to small mirrors where the thermal load is concentrated, again leading to larger temperature variations.

In the embodiments shown, the component depicted is a mirror in a reflective lithographic apparatus. However, the invention is not limited in this respect, and it will be understood that the component may also be a lens or other optical element in a transmissive lithographic apparatus.

By providing at least one component in the apparatus that in use experiences a heat load with an integrally mounted heating element arranged to maintain the component at a substantially constant temperature, heating and cooling effects on the component may be minimized or even avoided. Due to the component being subject to reduced thermal gradients, less optical distortions may be experienced. The present invention has application during fabrication and/or testing of components during manufacture and maintenance. In one embodiment, the substantially constant temperature is a mean operating temperature of the lithographic apparatus. In this way, the component can be tested during fabrication to produce and/or measure the component's behavior at operational temperature. The results of the testing may be used to determine an optimal temperature setting in the exposure unit using a thermal tuning algorithm to determine the temperature which results in the lowest optical distortions. For example, the temperature of the mirror or lens in the illumination and/or projection systems which result in the lowest optical distortions. In a further embodiment, the component includes an optical element disposed in a frame in at least one of the illumination system and projection system. By maintaining the temperature of the optical element at a substantially constant temperature, the heat load and thermal gradients on the frame are reduced, resulting in a reduction of image drift.

Figure 2:
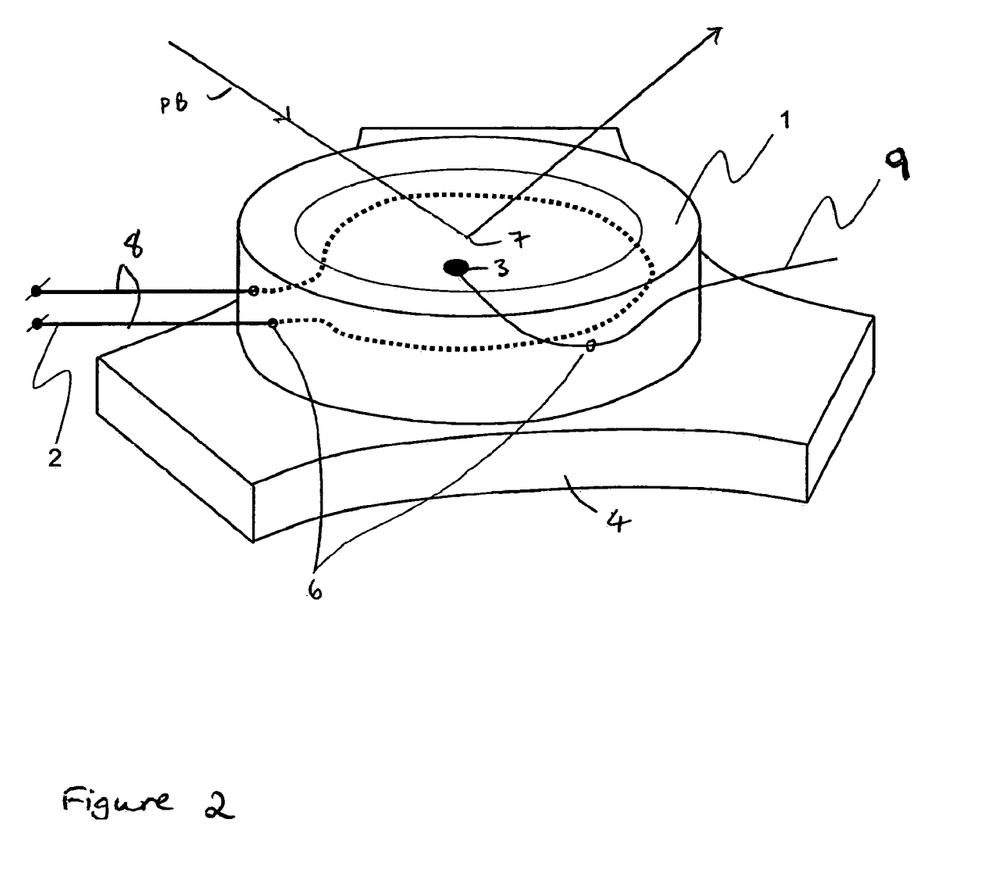
FIG. 2 depicts a component of the apparatus of FIG. 1.

FIG. 2 depicts a component according to an embodiment of the invention. In particular, FIG. 2 depicts an optical element 1 for use in a lithographic apparatus. In FIG. 2, the optical element 1 is a mirror for use in a lithographic apparatus operating in the EUV region. The optical element 1 is provided with an electrical heating element 2 and a temperature sensor 3. In response to a temperature sensed by the temperature sensor 3, the heating element 2 is arranged to maintain the optical element 1 at a substantially constant predetermined temperature. The heating element 2 includes an electrical heater, for example, a coil. The heating element 2 is provided with a power supply and heating element control unit, which are described in more detail with reference to FIG. 4. The heating element 2 provides direct heating to the optical element 1. The optical element 1 is disposed in at least one of the illumination system IL and the projection system PS, where in use, it is subject to a thermal load caused by the projection beam and patterned beam PB, respectively. The optical element 1 may be disposed in a frame 4. The beam PB is incident at a location 7 on a surface of the optical element 1. The thermal load caused by the incident beam PB is distributed throughout the optical element 1. However, the majority of the thermal load is distributed in a volume of the optical element 1 located in the vicinity of the location of incidence 7. The heating element 2 is controlled to heat the optical element 1 so that the temperature of the optical element 1 is substantially constant. The temperature sensor 3 is disposed in the thermal center of the heating element 2. The heating element 2 may be a resistant wire, or an electrical coil. The resistant wire may be made of materials such as constantan, which is a copper-nickel alloy with a high electrical resistance and a low temperature coefficient. In one embodiment, the heating element 3 is provided in a channel 6 formed in the optical element 1. The channel 6 extends within the volume of the optical element 1. The orientation of the heating element 2 will depend on factors such as the particular thermal load for a particular thermal component and the distribution of the thermal load in the component. The thermal load to which the component is subjected may be determined using a thermal analysis, such as a FEM analysis. The optimum temperature distribution by the electrical heating elements depends on various factors including the material characteristics of the component, in particular, the coefficient of thermal expansion (CTE) of the component and also the distribution of the dose of the projection beam or patterned beam PB on the component, and, furthermore, the thermal characteristics of the optical element (e.g. thermal conductivity, heat transfer to environment and heat capacity). The optical element may be made of a material having a low CTE, for example, ZERODUR®, which has an extremely low CTE of approximately, $5 \times 10^{-9} K^{-1}$. Using the material characteristics and the dose distribution, the FEM analysis establishes a non-uniform material model of the component, from which the distribution of the thermal load on the component can be established. It has been found that certain components are subject to a higher thermal load than other components. Depending on the thermal load and the distribution of the thermal load, the heating element 2 or elements can be arranged. Furthermore, the imperfection of the individual optical components due to material, production and mounting effects may be tuned by the separate temperature control loops to minimize the optical aberration of the system. These aspects are described in further detail with reference to FIGS. 3 and 4.

In FIG. 2, at least one of the radiation beam and patterned radiation beam is incident on the optical element at an incidence area. The channel 6 is formed in a bulk of the material of the optical element 1 in the vicinity of the incidence area 7 of the radiation or patterned radiation beam, respectively. The channel 6 extends within the bulk material in a direction corresponding substantially to a circumference of the incidence area 7 of the radiation or patterned radiation beam, respectively. Preferably, the channel is disposed in the body of the optical element 1 just below the optical plane where the radiation or patterned radiation beam PB is incident on the surface of the optical element 1. In a preferred embodiment, the channel 6 extends so that it corresponds to the shape of the cross section of the radiation or patterned radiation (projection) beam PB at the incidence area 7. For example, if the radiation or patterned radiation beam PB possesses a circular or substantially circular symmetry at the optical plane of incidence on the optical element 1, the channel 6 is constructed so that it extends in a manner corresponding to the symmetry of the incident beam PB. The channel 6 may be drilled or machined in the optical element, or by means of any other suitable method. Subsequently, the heating element 2 is inserted into the channel 6. The opening formed in the optical element by the channel 6 may then be closed with a material having a similar or same CTE as the optical element material, for example, Zerodur. In an alternative embodiment, the heating element 2 may be attached to an outer or underside of the optical element 1 by gluing or other appropriate method. The temperature sensor 3 may be mounted in a similar manner to the heating element 2. For example, a channel 6' may be formed in the optical element 1. The channel 6' is constructed to extend from an outer side of the optical element 1 to the thermal center of the heating element 2 with which the temperature sensor 3 is associated. The leads 8, 9 from the heating element 2 and temperature sensor 3, respectively, are connected to a heating element controller as further described with reference to FIG. 4. The temperature sensor 3 is preferably a high resolution sensor, such as a negative temperature coefficient (NTC) sensor. Alternatively, it may be a platinum sensor, such as a PT500 or a thermocouple.

Figure 3:
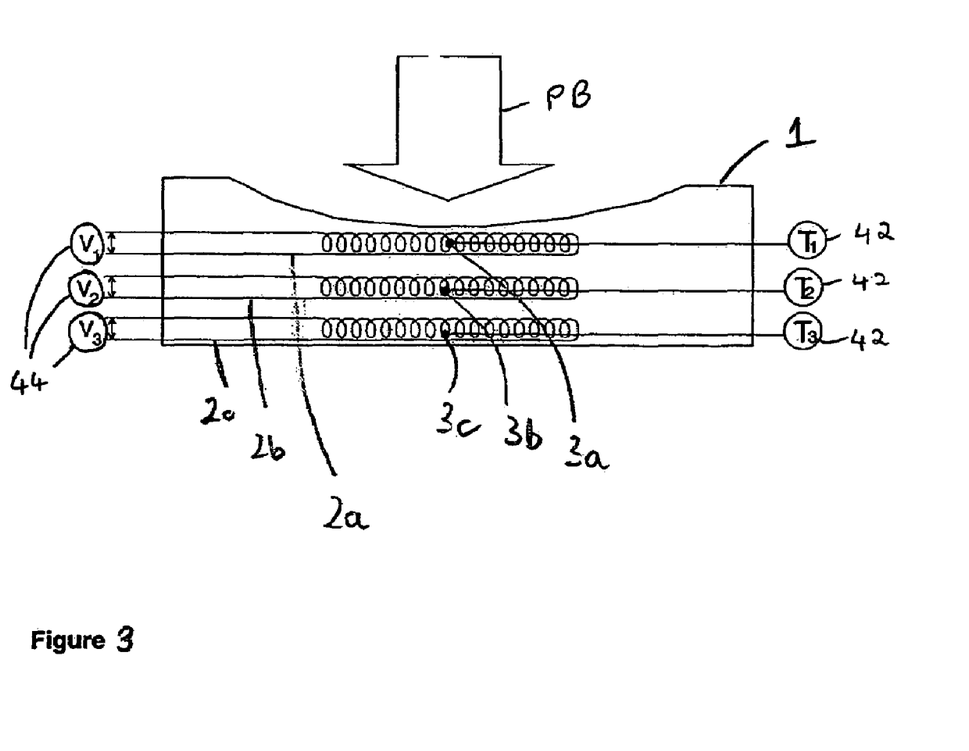
FIG. 3 depicts a component of the apparatus of FIG. 1.

FIG. 3 depicts a component according to a further embodiment of the invention. In particular, FIG. 3 depicts an example of a optical element 1 suitable for use in a lithographic apparatus operating at an EUV wavelength including three independently controlled heating elements 2a, 2b, 2c wherein each heating element 2a, 2b, 2c is associated with a corresponding temperature sensor 3a, 3b, 3c, respectively. In this way, each heating element 2a, 2b, 2c may be controlled independently from each other. Depending on the thermal load to which the component, such as optical elements and lenses, are subject, it may be desirable to provide a plurality of heating elements 2a, 2b, 2c integrally mounted in the component. In this way, the temperature of the component, such as optical element 1, may be accurately controlled. While the example in FIG. 3 shows a plurality of heating elements 2a, 2b, 2c disposed in substantially parallel planes, the invention is not limited in this respect. The particular arrangement of the plurality of heating elements may be determined on the basis of the thermal analysis. For example, in a further embodiment, it may be preferable to dispose at least one of the heating elements in a first plane below the optical plane where the projection or patterned beam PB is incident on the optical element and to dispose other heating elements in further planes not parallel to the first plane, but for example, in planes substantially orthogonal to the first plane. For example, heating elements may be disposed around the edge of the circumference of the optical element in planes substantially orthogonal to the optical plane of the incident beam PB. In FIG. 3, a plurality of temperature sensors 3a, 3b, 3c are provided, wherein each temperature sensor 3a, 3b, 3c is disposed in the vicinity of one of the plurality of heating elements 2a, 2b, 2c. Preferably, the temperature sensors 3a, 3b, 3c are disposed at the thermal center of their respective heating element 2a, 2b, 2c, so that the plurality of heating elements are controllable independently of each other, in response to the respective temperatures sensed by the plurality of temperature sensors 3a, 3b, 3c disposed in the vicinity of the respective heating elements 2a, 2b, 2c. In response to the temperatures T1, T2, T3 sensed by the temperature sensors 3a, 3b, 3c, respectively, a heater supply controller 44 controls the voltage V1, V2, V3, respectively, applied to the resistance wire of the heating elements 2a, 2b, 2c, respectively.

Figure 4:
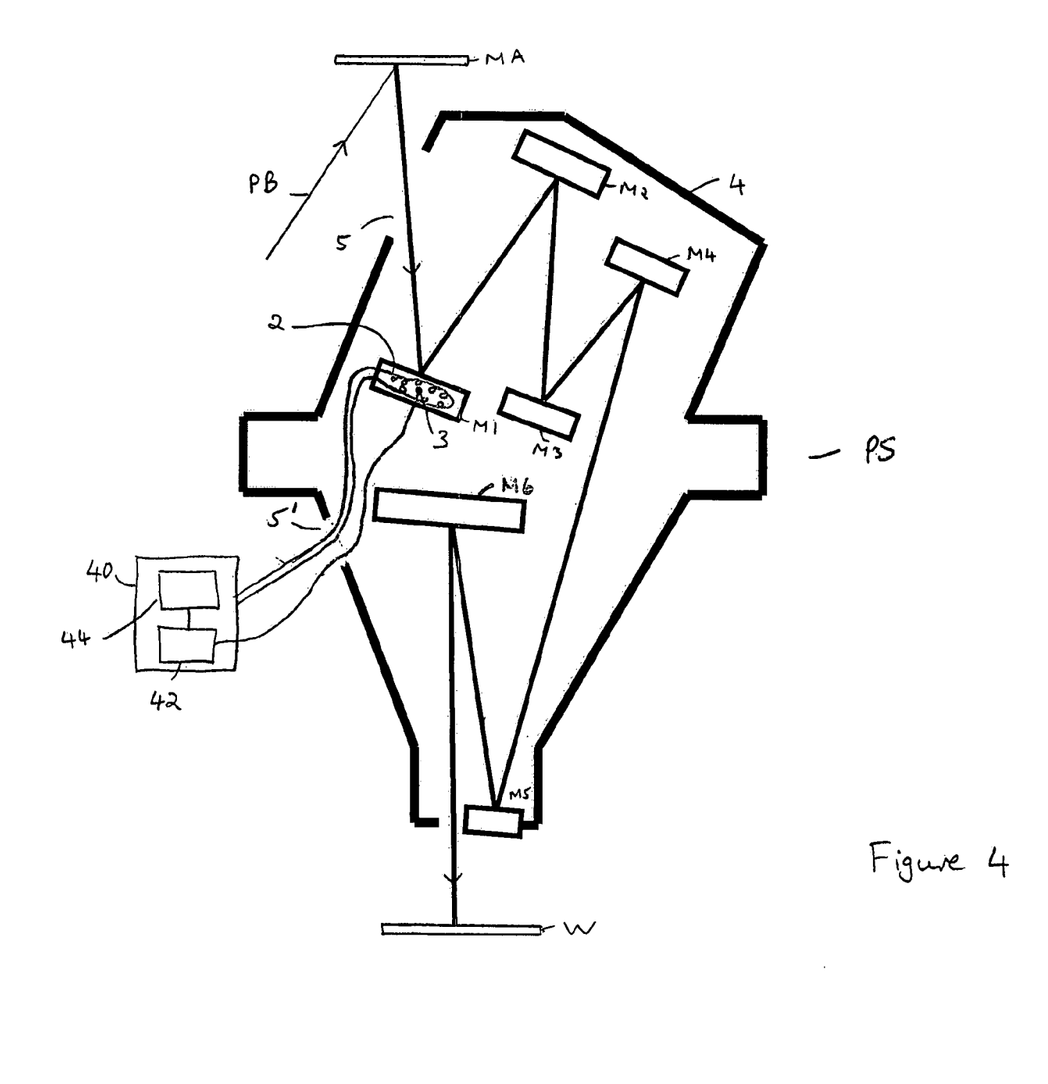
FIG. 4 depicts a component mounted to a frame in the lithographic apparatus of FIG. 1.

FIG. 4 depicts details of a lithographic apparatus including a component mounted in a frame according to an embodiment of the invention. In particular, FIG. 4 depicts a projection system PS. The projection system PS includes a frame 4, otherwise referred to in the art as a projection optics assembly, which supports a plurality of optical elements M1-M6 that are disposed in a spaced relationship. The frame 4 is provided with an opening 5 through which the patterned beam PB enters the assembly. The frame 4 may be provided with a further opening 5' through which the heating element controller 44 is connectable with the heating element 2. In this way, the control of the heating elements 2 may be carried out remotely. The patterned beam PB is incident on the plurality of optical elements, shown as optical elements M1-M6 in a predetermined order. In particular, the patterned beam PB is incident on the optical elements M1-M6, in the order M1, M2, M3, M4, M5 and M6, wherein M1 is the first optical element and M6 is the last optical element. Having been reflected by the last optical element M6, the patterned beam PB is incident on the substrate W. It has been found that the higher the optical element is in the incidence order the greater thermal load it receives in use from the patterned beam PB. Thus, the first optical element M1 receives a higher thermal load than M2. The second optical element M2 receives a higher thermal load than M3, etc. It has been found that by varying the number of heating elements provided per optical element M1-M6 in accordance with the thermal load they bear, the temperatures of the optical elements M1-M6 can be controlled to be substantially constant with respect to each other and the predetermined temperature. For example, while optical element M1 may be provided with four heating elements provided in an arrangement in accordance with the distribution of the thermal load, the last optical element M6 may only require one or two or even no heating elements. In one embodiment, a plurality of the optical elements are provided with at least one of the heating elements, in which the number of heating elements provided for each respective optical element is determined in accordance with the thermal load to which each of the optical elements is subjected to in combination with the sensitivity for optical aberration of this optical component with respect to this thermal load. In a further embodiment, first optical element M1 on which at least one of the projection beam and patterned beam is incident first is provided with a number of heating elements exceeding the number of heating elements provided with at least one of the optical elements M2, M3, M4, M5, M6 disposed downstream of the first optical element in the direction of the propagation of the at least projection beam and patterned beam. In this way, the temperature of the optical elements may be more accurately controlled. In particular, it has been found that controlling the temperature of the first optical element M1 may have the greatest effect since it receives the largest thermal load. As previously mentioned, other components, such as smaller components that also receive a relatively large thermal load may require a larger number of heating elements than other components. The same may be stated for very sensitive optical components in the optical system.

While FIG. 4 shows a first optical element M1 provided with a heating element 2 and a temperature sensor 3, this is a schematic representation and not intended to limit the invention. As described above, at least one of the optical elements may be provided with at least one or more heating elements in accordance with the thermal load each optical element bears with respect to the other optical elements. FIG. 4 depicts only one heating element by way of example, only.

The control of the heating elements is now described in further detail with reference to FIG. 4. As shown in FIG. 4, the apparatus further includes a power supply 40 and a heating element controller 44 for controlling the heating element 2 in response to the temperature measured by the temperature sensor 3 and communicated to the heating element controller 44 via component 42. The heating element controller 44 is arranged to control the voltage supplied by the power supply 40 to the heating element 2. If so desired, the heating element controller 44 may control the power supply 40 to control the voltage supplied by the or more than one power supplies (not shown) to a plurality of heating elements. In FIG. 4, the heating element controller 44 is depicted as forming a component of the power supply 40. However, in an alternative embodiment, the heating element controller 44 may be provided remotely from the power supply or power supplies, if there is a plurality of power supplies (not shown).

In accordance with an embodiment of the present invention, the heating elements are controlled so that they are maintained at a predetermined temperature. The control may be carried out using proportional and differential (PID) control but also other control algorithms may be used. The predetermined temperature will vary depending on the particular application of the present invention. For example, when a lithographic apparatus is first switched on the temperature of the apparatus is relatively low, for example, 22 degrees Celsius. While the apparatus is running, its temperature rises to a steady state temperature of, for example, 35 degrees Celsius. In accordance with an embodiment of the present invention, the heating element or elements are controlled so that they are constantly at a steady state. Thus, for the particular application mentioned above, if a set point is selected as the predetermined temperature is a temperature that is slightly higher than the steady state temperature of the lithographic apparatus, for example, 37 degrees Celsius, the heating element controller 44 will cause the heating elements to heat up to the predetermined temperature. The heating element controller 44 is arranged in response to the temperatures measured by the temperature sensors to maintain the components at the predetermined temperature. Because, the components are brought into a steady state, that is for example, at a temperature slightly higher than the steady state of the lithographic apparatus, as the lithographic apparatus is in use, the temperature of the optical elements does not rise higher than the predetermined temperature. Thus, when the apparatus is turned on, it is seen that the voltage supplied to the heating elements is initially high. As the lithographic apparatus warms up, the voltage supplied to the heating elements will drop over time.

In an embodiment, in order to determine the distortions due to imperfections of a component, for example, during testing, manufacture or maintenance, the substantially constant temperature is a mean operating temperature of the lithographic apparatus. In this way, the behavior of the component may be analyzed as if it were in situ in the apparatus. Furthermore, during manufacturing and assembly of the optical element and of the total optical system, it will be possible to tune the temperature, in the case of one heating element control, or temperature distribution, in the case of multiple heating controls, in such a way that the optical distortions may be minimized.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising the following components:
   i) an illumination system configured to condition a radiation beam;
   ii) a support constructed to support a patterning device, the patterning device being capable of imparting the radiation beam with a pattern in its cross-section to form a patterned radiation beam;
   iii) a substrate support constructed to hold a substrate; and
   iv) a projection system configured to project the patterned radiation beam onto a target portion of the substrate, at least one of said components i)-iv) provided with an electrical heating element integrally mounted in the component and arranged to maintain the component at a substantially constant temperature, the component experiencing a heat load when in use, wherein the heating element is a resistance wire or an electrical coil.

2. An apparatus according to claim 1, wherein the component comprises at least one temperature sensor, and wherein the heating element is arranged to maintain the component at a substantially constant predetermined temperature in response to a temperature sensed by the at least one temperature sensor.

3. An apparatus according to claim 2, wherein the apparatus further comprises a heating element controller for controlling the heating element in response to the temperature measured by the at least one temperature sensor.

4. An apparatus according to claim 3, wherein the heating element controller controls voltage supplied by a power supply to the heating element.

5. An apparatus according to claim 3, wherein the heating element controller is disposed at a location remote from the component.

6. An apparatus according to claim 2, wherein the at least one temperature sensor is disposed at a thermal center of the heating element.

7. An apparatus according to claim 1, wherein the substantially constant temperature is a mean operating temperature of the lithographic apparatus.

8. An apparatus according to claim 1, wherein the heating element provides direct heating to the component.

9. An apparatus according to claim 1, wherein the component is provided with a plurality of integrally mounted heating elements and a plurality of temperature sensors, wherein each temperature sensor is disposed in the vicinity of one of the plurality of heating elements, so that the plurality of heating elements are controllable independently of each other, in response to the respective temperatures sensed by the plurality of temperature sensors disposed in the vicinity of the respective heating elements.

10. An apparatus according to claim 1, wherein the component is an optical element disposed in at least one of the illumination system and the projection system.

11. An apparatus according to claim 10, wherein the optical element is disposed in a frame.

12. An apparatus according to claim 11, wherein a plurality of optical elements are disposed in the frame in a spaced relationship, wherein a plurality of the optical elements are provided with at least one of the heating elements, wherein the number of heating elements provided for each respective optical element is determined in accordance with the thermal load to which each of the optical elements is subjected to.

13. An apparatus according to claim 12, wherein at least one of the radiation beam and the patterned radiation beam is incident on the plurality of optical elements in a predetermined order, and wherein a first optical element on which at least one of the radiation beam and patterned radiation beam is incident first is provided with a number of heating elements exceeding the number of heating elements provided with at least one of the optical elements disposed downstream of the first optical element in the direction of the propagation of the at least projection beam and patterned beam.

14. An apparatus according to claim 10, wherein the projection system comprises a frame in which the optical element is mounted, wherein the frame is provided with an opening through which the heating element controller is connectable with the heating element.

15. An apparatus according to claim 1, wherein the component comprises a volume which is subject in use to a thermal load, the component being provided with a channel disposed in the component in which the heating element is disposed, wherein the channel extends within the volume.

16. An apparatus according to claim 15, wherein at least one of the radiation beam and patterned radiation beam is incident on the component at an incidence area, wherein the channel is formed in the component in the vicinity of the incidence area.

17. An apparatus according to claim 16, wherein the channel extends within the component in a direction corresponding substantially to a circumference of the incidence area.

18. A lithographic projection apparatus arranged to project a pattern from a patterning device onto a substrate, wherein at least one component in the apparatus that in use experiences a heat load is provided with an electrical heating element integrally mounted in the component and arranged to maintain the component at a substantially constant temperature, wherein the heating element is a resistance wire or an electrical coil.

19. An illumination system configured to condition a radiation beam, the illumination system comprising an optical element, wherein the optical element is provided with an electrical heating element integrally mounted in the optical element and arranged to maintain the optical element at a substantially constant temperature when in use under thermal load, wherein the heating element is a resistance wire or an electrical coil.

20. A projection system configured to project a patterned radiation beam onto a target portion of a substrate, wherein the projection system comprises an optical element, wherein the optical element is provided with an electrical heating element integrally mounted in the optical element and arranged to maintain the optical element at a substantially constant temperature when in use under thermal load, wherein the heating element is a resistance wire or an electrical coil.

21. An optical element for a lithographic apparatus comprising an electrical heating element integrally mounted in the optical element and an integrally mounted temperature sensor, wherein in response to a temperature sensed by the temperature sensor, the heating element is arranged to maintain the optical element at a substantially constant predetermined temperature, wherein the heating element is a resistance wire or an electrical coil.

22. A device manufacturing method for a lithographic apparatus, the method comprising:
   patterning a beam of radiation;
   projecting the patterned beam of radiation onto a target portion of a substrate,
   maintaining at least one component experiencing a heat load in the apparatus at a substantially constant temperature with an electrical heating element integrally mounted in the component, wherein the heating element is a resistance wire or an electrical coil.

23. A lithographic apparatus comprising the following components:
   i) an illumination system configured to condition a radiation beam;
   ii) a support constructed to support a patterning device, the patterning device being capable of imparting the radiation beam with a pattern in its cross-section to form a patterned radiation beam;
   iii) a substrate support constructed to hold a substrate; and
   iv) a projection system configured to project the patterned radiation beam onto a target portion of the substrate,
   at least one of said components i)-iv) provided with an integrally mounted electrical heating element and a temperature sensor disposed at a thermal center of the heating element, the heating element being arranged to maintain the component at a substantially constant temperature, the component experiencing a heat load when in use.

24. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate; and
   a plurality of optical elements disposed in a spaced relationship in a frame of at least one of the illumination system and the projection system, the plurality of optical elements each having at least one integrally mounted electrical heating element arranged to maintain the respective optical element at a substantially constant temperature,
   wherein at least one of the radiation beam and the patterned radiation beam is incident on the plurality of optical elements in a predetermined order, and wherein a first optical element on which at least one of the radiation beam and patterned radiation beam is incident first is provided with a number of heating elements exceeding the number of heating elements provided with at least one of the optical elements disposed downstream of the first optical element in the direction of the propagation of the at least projection beam and patterned beam.

* * * * *